United States Patent [19]

Edwards et al.

[11] Patent Number: 5,380,682
[45] Date of Patent: Jan. 10, 1995

[54] WAFER PROCESSING CLUSTER TOOL BATCH PREHEATING AND DEGASSING METHOD

[75] Inventors: Richard C. Edwards, Ringwood, N.J.; Michael S. Kolesa, Suffern, N.Y.; Hiroichi Ishikawa, Mahwah, N.J.

[73] Assignee: Materials Research Corporation, Orangeburg, N.Y.

[21] Appl. No.: 147,666

[22] Filed: Nov. 3, 1993

Related U.S. Application Data

[62] Division of Ser. No. 701,800, May 17, 1991, Pat. No. 5,259,881.

[51] Int. Cl.⁶ .................. H01L 21/00; H01L 21/02; H01L 21/302; H01L 21/463
[52] U.S. Cl. ................................. 437/225; 437/228; 437/247; 437/248
[58] Field of Search ................. 437/225, 228, 247, 248

[56] References Cited

U.S. PATENT DOCUMENTS 5,147,823  9/1992  Ishibashi et al. .................. 437/225
5,248,636  9/1993  Davis et al. ...................... 437/225

Primary Examiner—Brian E. Hearn
Assistant Examiner—B. Everhart
Attorney, Agent, or Firm—Wood, Herron & Evans

[57] ABSTRACT

A wafer processing cluster tool, having one or more load-locks, is provided with one or more batch preheating modules that receive wafers only from the cluster tool transport module at the internal vacuum pressure of the machine. The loading, unloading, handling and processing of wafers in the machine can occur while other wafers are being preheated. The preheat module has a vertically moveable rack and is loaded with various sized batches of wafers with no vacant positions between them. Wafer shaped shields may occupy positions adjacent top and bottom wafers to cause them to heat the same as other wafers in the rack. Infrared lamps positioned outside of quartz windows heat wafers in the preheat module. The rack may rotate to improve heating uniformity. Temperature sensors, such as pyrometers, that do not contact the wafers being preheated, measure temperature for control of the heating of the lamps.

12 Claims, 3 Drawing Sheets

WAFER PROCESSING CLUSTER TOOL BATCH PREHEATING AND DEGASSING METHOD

This application is a divisional of application Ser. No. 07/701,800 filed May 17, 1991 now U.S. Pat. No. 5,259,881.

The present invention relates to the processing of wafers such as semiconductor wafers, and, more particularly, to the removal of surface and absorbed impurities such as water vapor and other gasses from silicon wafers preliminary to the coating or etching thereof. More particularly, the present invention relates to preprocessing by preheating of wafers being individually processed in modular processing systems such as cluster tools.

BACKGROUND OF THE INVENTION

The presence of gases on the surfaces of or contained within silicon wafers during the performance of coating or etching processes on the wafers is becoming a problem of increased importance in the manufacture of integrated circuits and semiconductor devices. As devices become smaller and the manufacturing process more precise, the presence of molecules of vapor on the surfaces that are to be coated or etched is emerging as a significant contributor to the production of defective devices. When coating and etching processes are performed, for example, by sputtering, any foreign particles on the surface being processed can result in a microscopic area that escapes the process. Accordingly, an essential circuit path or electrical characteristic of the device on which the affected area lies may be defective and the device unusable.

Gases such as water vapor are typically present on the surfaces of the wafers and are contained within the bodies of wafers when the wafers are introduced into processing machines, which typically contain a sealed vacuum environment. During the course of the coating or etching processes performed on a wafer, heat is often applied to the wafer or is generated by the performance of the process itself, or both. Sputter coating and etching processes, chemical vapor deposition process (CVD), and other physical or chemical coating and etching processes, performed with or without plasma, frequently require the wafer substrate to be elevated to temperatures of, for example, 500° C. or 1000° C. for the process to proceed optimally. Without subjecting the wafers to deliberate heating, the physical and reactive processing of the wafer surface usually generates heat that will elevate the temperature of the wafer itself to, for example, 600° C. As a result, water molecules embedded in the silicone of the substrate may be released and may locate on the surface being processed, shielding an area of the surface from the coating or etching process, or reacting with the processing gasses.

It has been recognized that gasses and water vapor can be removed, at least in part, from the wafers by heating or baking the wafer at some elevated temperature in a vacuum for a specified period of time. This specified period of time may be many times longer than that required for the complete processing of the wafer in a particular apparatus.

In processing machines such as cluster tools, a plurality of different and randomly accessible processing modules are connected to a common wafer handling or transport module, in which the wafers are maintained continuously at a vacuum pressure level, and into and out of which the wafers are transferred to and from an external atmospheric pressure environment through one or more load-locks. In wafer processing, pretreating of the wafers to eliminate contaminates, to be effective, must take place after the wafers are sealed in the internal vacuum environment from which they will not be removed prior to processing. In such cluster tools, the preheating of wafers for the time necessary to rid them of gasses and other dissolved contaminants is a step that will often seriously reduce the productivity or through-put of the machine.

In U.S. Pat. No. 4,923,584, there is disclosed a provision for heating batches of wafers while held in load-lock or cassette modules of a wafer processing cluster tool, for the purpose of removing absorbed contaminants from the wafers. In such a device, a batch of wafers would be loaded into the load-lock through the load-lock door while the load-lock is opened to the atmosphere. When the load-lock is sealed and pumped to a vacuum, the batch of wafers is heated. When the heating is complete, the load-lock is opened to the interior of the cluster tool and the wafers are individually removed from the load-lock and one-by-one transported to the various modules for processing. In the device of this patent, two load-locks are provided, allowing one to be loaded or unloaded while the other is subjecting a batch of wafers to prolonged heating. The preoccupation of one of the load-locks of a two load-lock machine for prolonged preprocessing, however, deprives the machine of the loading and unloading flexibility for which the two load-locks were provided, resulting, in some cases, in delays in the operation of the machine.

Provision for batch heating in a load-lock, however, presents several problems. Industry standard cassettes for use in wafer processing cluster tools are usually made of a plastic such as polypropylene. Ideally, a cassette, preloaded with wafers, is positioned in the load-lock from the outside and sealed with the wafers in the load-lock. Such plastic materials will not, however, withstand the temperatures needed for effective preheating to remove gasses from the wafers. Therefore, the above identified patent proposes employment of a metal rack or holder within the load-lock. Such a rack must either replace the standard cassette or be loaded with the wafers from the cassette at the lock. Metal wafer holders, however, are, in some situations, prone to contaminate wafers as metal atoms propagate from the holder into the wafer at or near the points of where the rack contacts the wafers. In that the load-locks are usually loaded and unloaded manually, the use of fragile quartz racks is impractical. Furthermore, the use of a special rack in the load-lock precludes mere insertion into the load-lock of an industry standard cassette. This requires a separate loading and unloading step, either at the load-lock or at a separate external location.

Importantly, however, heating in a load-lock presents the problem of exposure of the heated internal structures of the load-lock to atmosphere, which increases the incidence of corrosion from oxygen contact and water vapor in the air. In addition, the opening of the load-lock when the contents are hot exposes persons loading and unloading the load-locks to the hazards of the high temperatures, a hazard that can be avoided at the expense of providing the machine with front-end robots, or wasting production time by allowing the load-lock to cool.

Notwithstanding the above efforts of the prior art, there remains a need to provide an efficient and effective method and apparatus for removing gasses and other absorbed contaminants from the surfaces and bodies of wafers in a sealed environment of a processing apparatus prior to the processing of the wafers, and to do so without introducing into the process the disadvantages and hazards of the prior art.

SUMMARY OF THE INVENTION

It is a primary objective of the present invention to provide a batch preheating capability for a wafer processing machine, particularly a machine of the modular cluster tool type, which can preprocess the wafers while keeping both the wafers and the structure utilized for the preprocessing step out of contact with the external atmosphere.

It is a further objective of the present invention to provide a batch wafer pretreatment capability that will not detract from, and will add to, the speed and flexibility of the wafer processing equipment.

It is a more particular objective of the present invention to provide a batch preheating, degassing and desorbtion module for the pretreatment of silicon semiconductor wafers that communicates only with the internal environment of a cluster tool during the course of its operation.

It is a more specific objective of the present invention to provide a batch preheat module configuration for a wafer processing cluster tool that will subject wafers to prolonged controlled preprocess treatment while supporting a through-put rate required by the faster processes of the machine.

According to the principles of the present invention, there is provided a batch preheat module for a cluster tool that connects to the internal environment of a wafer processing cluster tool at a point, preferably at a hub or transport module, maintained continuously at the inert vacuum environment of the machine beyond the load-lock.

In accordance with one preferred embodiment of the invention, there is provided a configuration of cluster tool having a plurality of batch preheat chambers, and preferably two in number, that each connect to a transport module, and preferably the same transport module, and from which transport module it is exclusively loaded and unloaded. The transport module to which the preheat chambers connect is further preferably connected to one or more load-lock modules through which the transport module is loaded and unloaded with wafers to pass them to and from the external environment, while continuously isolating the transport module from the external environment.

The pair of modules are operated such that one can be initially loaded with wafers sequentially from the transport module and then heated as a batch. While the heating is taking place, the other preheat module can be loaded in a similar way with a second batch of wafers. After the first batch of wafers has been heated for a required prolonged period of time, the wafers from it may be transferred sequentially to other processing stations and then transferred to a load-lock for removal from the machine, while the second batch of wafers in the second load-lock is heated. When the first preheat module has been emptied of pretreated wafers, it is refilled with a third batch of wafers, while the second preheating module is still subjecting the second batch of wafers to prolonged heating.

By prolonged heating it is meant that the preheating process time is longer, perhaps four to eight times longer, than the average time of the processes performed in the other modules of the cluster tool. Therefore, once the initial batch of wafers has been preheated in one of the pretreatment modules, wafers from one preheating module can be sequentially transferred to and returned from the other processing chambers of the machine while another batch is being preheated and made ready for subsequent processing, without adversely affecting the productivity of the machine in performing the primary processes.

According to the preferred embodiment of the invention, each of the batch preheating modules is provided with moveable quartz rack capable of holding a full standard cassette load of twenty-five silicon wafers. The rack is moveable in a vertical direction on an elevator, which brings each of the horizontal vertically spaced wafer holding slots to a position adjacent a standard MESA gate valve through which each one of the wafers of the batch can be loaded to or unloaded from the transport module to which the pretreatment module is connected. Preferably, two extra wafer holding positions are provided in the rack to hold dummy wafers or shields that may be provided and that have heat absorption properties that insure that the topmost and bottommost wafers will heat at the same rate as the wafers that are central to the rack. The rack controls are programmed to move the rack to load the batch of wafers without spaces or unfilled positions between them, and to move the shields if necessary should less than a full cassette of wafers be loaded into the pretreatment module for batch processing. This programming enhances the predictability and uniformity of the preheating process regardless of the size of the batch being pretreated.

The pretreatment module according to the preferred embodiment of the invention is provided with two banks of quartz IR lamps on opposite sides of the chamber, each positioned outside of a quartz window. The quartz window passes a broad band of radiant energy therethrough that includes a portion of the visible and infrared light spectrum, for heating the wafers within.

To provide uniformity of heating, the internal surfaces of the module are preferably formed of highly reflective material such as stainless steel or similar material that may, if necessary, be externally insulated or cooled. In addition, the rack is further made to rotate slowly within the preheat chamber to enhance the uniformity of the heating from the lamps.

The lamps are controlled by a temperature control that responds to a temperature monitor signal from temperature sensors that do not contact the surfaces of the wafers being processed. Such sensors are preferably pyrometers, directed through windows onto surfaces of the wafers, for example downwardly at the top or device surface of the top wafer, or preferably at a slightly upwardly inclined angle from the side of the chamber at the bottom or backsides of several wafers of the batch. The temperature sensors are either provided with shield structure to block reflected radiation from the IR lamps from entering the sensors and to prevent detection of radiated heat from surfaces of other than the wafers being preheated. In the alternative, or in addition, the sensors are selected to be responsive to radiant heat from the wafers that is of a different wavelength, for example a longer wavelength, than that from the lamps that passes through the quartz windows of the chamber. Alternatively, sensing the temperature may be achieved by way of a direct contact sensor on an object such as a dummy wafer within the preheating chamber. The output of such a sensor is calibrated to correlate with the actual temperature of the wafers. The controller of the lamps is further provided with logic to anticipate the heating curve of the wafers in order to more accurately control the energy to the lamps in response to feedback signals from the temperature sensors.

The present invention provides the advantages of removing surface and absorbed vapor and gaseous contaminants from silicon wafers, thereby preventing or substantially reducing the formation of defects in the coating and etching processes. The preheating of the wafers after they have entered the vacuum environment of the processing apparatus enhances the effectiveness of the pretreating process. Avoidance of exposure to the atmosphere of heated internal machine components, avoidance of exposure of operators to heated cassettes and the ability to use conventional cassettes in the load-locks result from the provision of batch preheating chamber that is only internally accessible from the inert vacuum environment of the machine. The invention provides improved uniformity and controllability in pretreatment of the wafers. Efficient utilization of the processing apparatus and increased productivity result from the single pretreatment module and multiple pretreatment module configurations of the invention.

These and other objectives and advantages of the present invention will be apparent from the following detailed description of the drawings in which:

BRIEF DESCRIPTION OF THE DRAWINGS

FIG. 4 is a top cross-sectional view of the preprocessing module taken along the line 4—4 of FIG. 3.

DETAILED DESCRIPTION OF THE DRAWINGS

Figure 1:
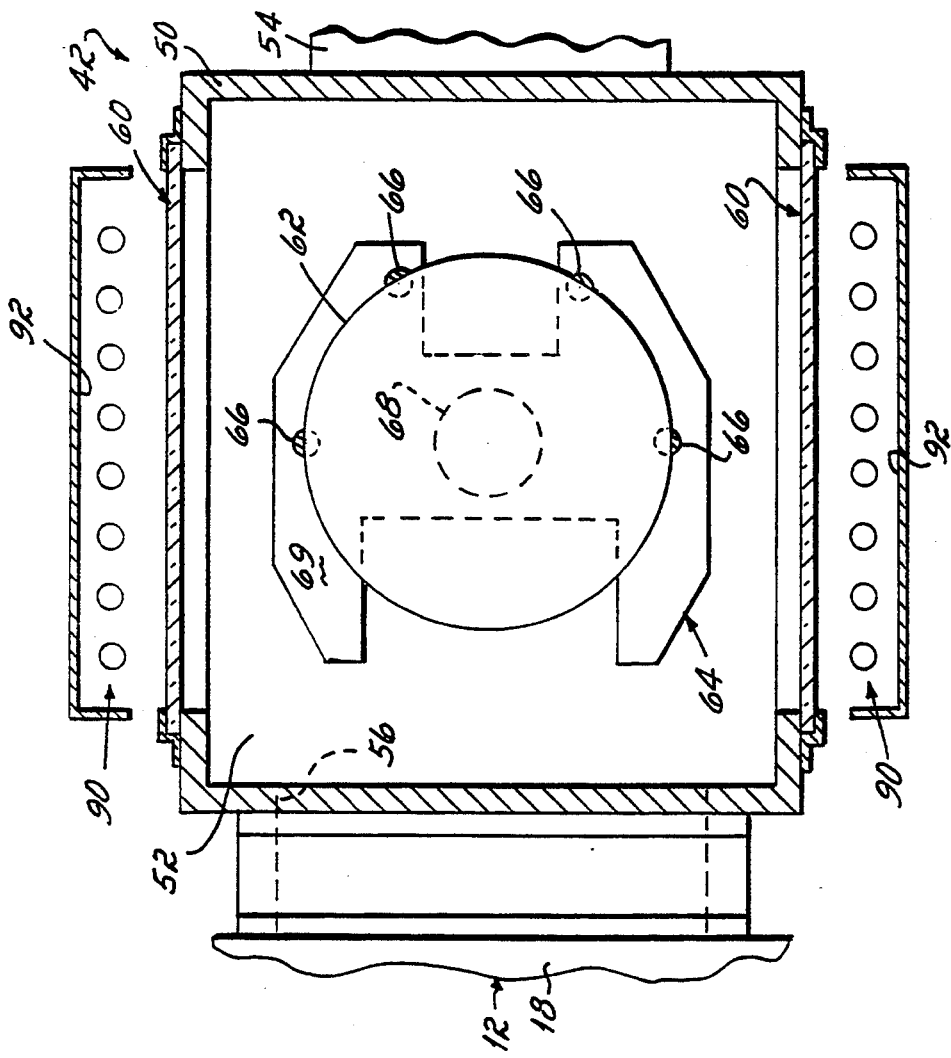
FIG. 1 is a plan diagram of a cluster tool configuration according to principles of the present invention.

Referring to FIG. 1, a cluster tool 10 according to the preferred embodiment of the present invention is illustrated. The cluster tool 10 includes one or more transport modules, in this embodiment two transport modules that include a front transport module 12 and a back transport module 14. Such transport modules of this type are manufactured by Brooks Automation of North Billerica, Mass. as its LTS Series module. The transport modules 12, 14 are provided with vacuum pumps (not shown) to maintain their internal chambers at a vacuum pressure level suitable for the processing of semiconductor wafers. Each of the transport modules is polygon shaped, presenting a plurality of sides, each having a wafer transfer port therethrough, for the connection of a processing or wafer handling module. Each of the ports permits transfer of wafers between the interconnected modules in a vacuum environment. Each of the ports is equipped with one or more gate valves, typically MESA standard gate valves, that provide for isolation of the environments of the transfer and processing or handling modules. Such valves are provided permanently attached to the transport modules 12, 14 to allow for removal of the processing or handling modules without interruption of the vacuum of the transport modules 12, 14. A second gate valve may be provided on each of the adjoining modules to permit retention of the vacuum within them when they are removed from the transport module.

The transport modules 12, 14 are interconnected by an interconnecting conduit and aligner 16 that joins the interiors of the transport modules 12, 14 to form a common transport chamber 18 at a consistent vacuum level and of a common atmosphere. Within the transport modules 12, 14 is a wafer transport mechanism or robot arm 20 that rotates about a central axis of the respective module 12, 14 and extends through the ports to load and unload single wafers from the adjoining modules, including the processing modules, handling modules and the other transport module.

The back transport module 14 has six module connection faces or sides for connection to six adjacent modules. On one of these sides is, in the illustrated embodiment, connected a soft etch module 22 for the cleaning or mild etching preconditioning of the surfaces of wafers. A second of these sides is connected to a first sputter coating module 24, which will typically perform a sputter coating process to deposit a uniform coating on the surface of the wafer, usually following the soft etch process in the module 22. Another or third side is connected to another processing module, a rapid thermal processing (RTP) module 26, for treating the wafer quickly with high temperatures of, for example 1000° C., to anneal or smooth a previously deposited coating, such as a metal coating deposited by a sputter coating process in the sputtering module 24. A forth side is connected to another processing module, for example a sputtering module 28, that may be a sputter etching module or another sputter coating module. A fifth face is connected to another processing module 30 that may be, for example, a chemical vapor deposition (CVD) module. The types of modules and the processes performed therein may be any process suitable to be performed on wafers in conjunction with the other processes being performed by the cluster tool. The sixth face of the transport module is connected to the aligner 16.

The front transport module 12 has five module connection faces for connection to five adjacent modules. One of these sides is connected to the module aligner 16, and two of these sides are each connected to one of two load-lock modules 32, 34 through which wafers are transferred between the chamber 18 of the transport modules 12, 14 and an external clean room environment 36. The environment 36 is separated from a controlled internal environment 38 that surrounds the cluster tool 10 by a sealed wall 40. The environments 36 and 38 are both at atmospheric pressure.

The load-locks 32, 24 each have an access door through which a standard cassette of, for example 25, wafers are held in a rack, usually made of a plastic material such as polypropylene. The racks are loaded and unloaded either manually or by robot through a load-lock access door 41 into each of the load-locks 32, 34. The access doors 41, when closed, seal internal load-lock chambers within the load-locks so that they may be pumped to the vacuum environment of the transport chamber 18 to permit entry of the wafers, transferred individually by the transport arm 20, into the transport chamber 18 and to the other modules of the cluster tool 10. When the transport arm 20 returns wafers to the load-locks 32, 34, the load-lock is vented to the external environment. Except when the load-locks are at the vacuum pressure level of the transport chamber 18, the gate valve between the transport chamber 18 and respective load-lock 32, 34 is closed.

Connected to the other two faces of the entry transport module 12 are two preferably identical batch preheating, degassing or desorbtion modules 42, 44. Each of these modules is equipped to receive, hold and preprocess a plurality of wafers simultaneously, preferably any number up to the quantity held in a full wafer cassette handled by the load-locks 32, 34.

Figure 2:
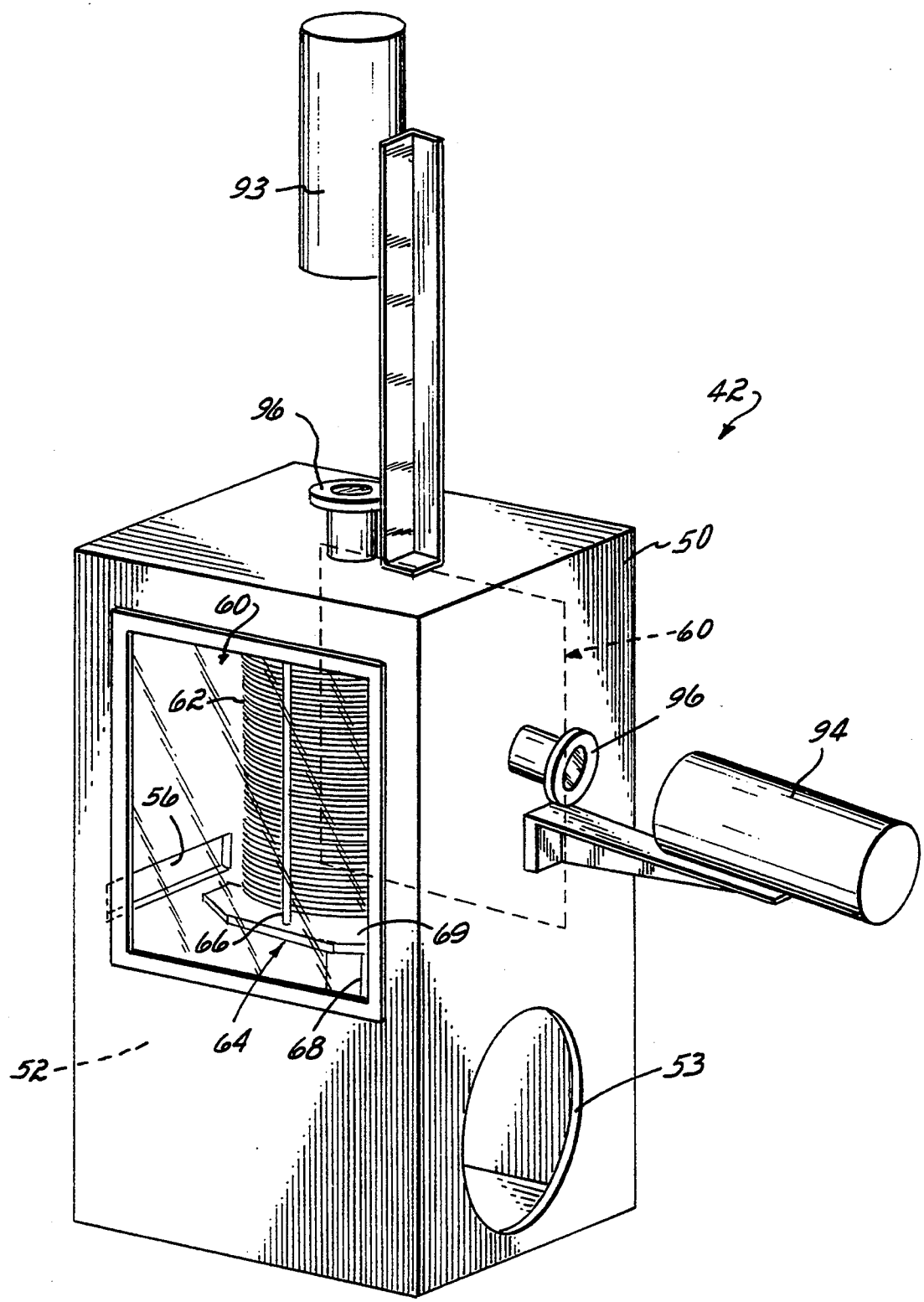
FIG. 2 is an isometric view of a preprocessing module of the cluster tool of FIG. 1 according to one embodiment of the present invention.

The batch preheating modules 42, 44 according to certain embodiments of the present invention, will be described in relation to the module 42. Referring to FIG. 2, the preheating module 42 includes a pressure tight housing 50 enclosing a preheating chamber 52. The housing has a hole 53 therein to which a high vacuum pump 54 (removed in this figure; see FIG. 3) is connected to maintain the chamber 52 at a high vacuum, typically equal to that of the transport chamber 18. The module 42 is also conventionally provided with a second pump (not shown) for lowering the pressure from atmospheric pressure to within the operating range of the pump 54, and with a vent port (not shown) for returning the pressure within the chamber 52 to that of the atmosphere. The housing 50 also has therein, on the front thereof, a rectangular port 56 to which the module is connected to a gate valve 58 (FIG. 3) of the front transport module 12.

On each side of the housing 50 is a rectangular quartz window 60, approximately one inch in thickness. The quartz window 60 allows the passage of infrared radiation into the chamber 52 to heat a batch of wafers 62 within. Within the chamber 52, the wafers 62 are supported on a quartz rack 64, formed of notched rods 66 supported on upper and lower end plates 67 and 69 respectively. The rack 64 is vertically moveable to bring a selected one of the notch positions adjacent the slot 56 for its insertion into, or removal from, the rack 64 by the transport mechanism 20.

Figure 3:
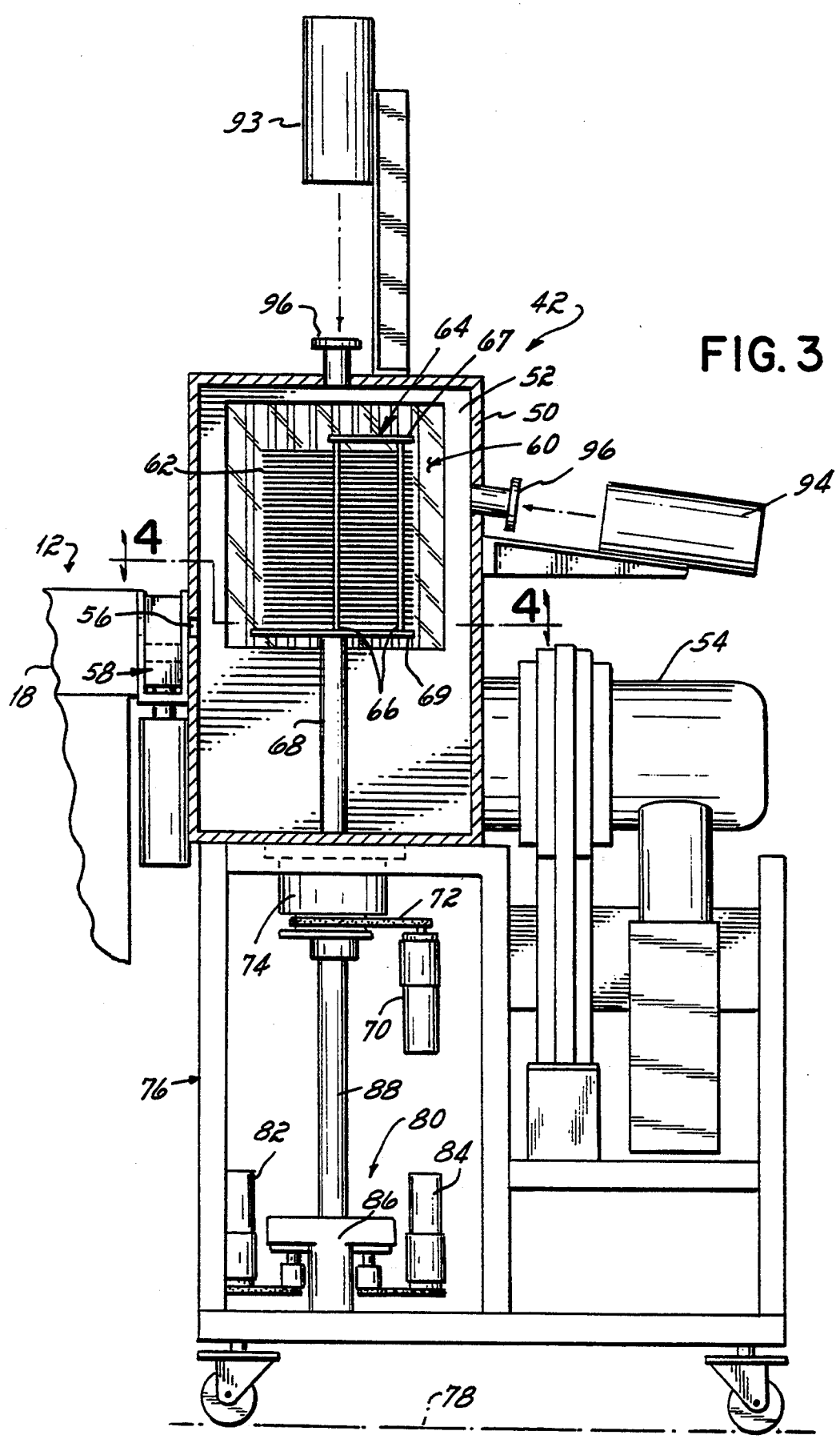
FIG. 3 is a side view, partially in cross-section, of the preprocessing module of FIG. 2.

Referring to FIGS. 3 and 4, the rods 66 of the rack 64 are four in number, two of which are spaced at approximately 180° from each other, on a diameter perpendicular to the port 56. The other two of the rods 66 are positioned about 60° apart and equidistant from the other two rods on the side of the rack opposite the slot 64, when the rack 64 is in its loading and unloading position. The rack 64 is rotatably mounted in the housing 50 on a rotatable shaft 68, to which a drive motor 70, located below the housing 50, is drivably connected through a belt 72 that engages the pulley of a ball gear screw 74.

The motor 70, pump 54 and housing 50 are rigidly supported on a wheeled base 76 such that the slot 56 is at the vertical height of the gate valve 58 above floor 78 and is alignable therewith. Also rigidly mounted on the base 76 is an elevator drive 80 that includes a pair of motors 82, 84 connected to a gear mechanism 86 at the base of a tubular column 88 that encases a spirally geared end (not shown) of the shaft 68. The motors 82, 84 are stepping motors that raise and lower the shaft 68 to raise and lower the rack 64 to bring any selected one of the notch positions of the rods 66 into alignment with the slot 56, to load or unload wafers 62.

As illustrated in FIG. 4, the rack 64 is shown in the position at which wafers 66 can be loaded and unloaded through the slot 56 and gate valve 58. When loaded, the gate valve 58 is closed and radiant infrared light is directed into the cavity or chamber 52 through the quartz windows 60 in the sides of the housing 50 from banks of quartz IR lamps 90 mounted on the outside of the housing 50. Behind each bank of the lamps 90 is a cooled reflector 92. Each of the banks 90 includes, in the embodiment shown, eight lamps, each of approximately 2000 watts of power.

The energy to the lamp banks 90 is controlled in response to signals from one or more temperature sensors, shown as upper and lower sensors 93, 94, respectively, which are preferably pyrometers that sense temperature at a frequency other outside of the band of energy passing through the quartz windows 60 from the lamps 90. The sensors 93, 94 are mounted on brackets on the outside of the housing 50 and aimed through lenses or windows 96 in the housing 50. The upper sensor is directed onto the upper surface of the top one of the wafers 62. The lower sensor 94, which is the preferable sensor position, is directed upwardly at an angle of approximately 7.5 inches to the horizontal, to read the temperature of the lower surfaces, or back sides of the wafers.

The notches in the rods 66 are spaced apart about $\frac{1}{2}$ inch, which is about twice the spacing of wafers in the cassette racks supported in the load-locks 32, 34. This additional spacing enhances the access of radiant energy from the lamps for better and more uniform heating of the wafers 66. In addition, the logic of the controller that controls the operation of the elevator drive 80 and the transport mechanism 20 is operable to maintain the stack of wafers 62 compressed, with no empty positions between any two of the wafers to be processed, to provide for better control of the preheating process and uniform heating of the wafers 62.

In addition, to provide for uniform heating of the top and bottom wafers of the stack, dummy wafers or shields may be provided in the end positions, which may remain in the chamber 52 or be removed with the wafer batches.

In the preferred sequence of operation of the preferred two load-lock, two preheat chamber embodiment, a cassette carrying the first batch of wafers to be processed is inserted into one of the load-locks 32, 34, for example load-lock 32, through its access door 41, with the gate valve that connects that load-lock to the transport module 12 closed. Then the door to the load-lock 32 is closed and the internal chamber of the load-lock 32 is pumped to the vacuum pressure level of the transport chamber 18. When this level is reached, the valve from the load-lock 32 to the transport chamber 18 is opened, and the wafers from the load-lock 32 are removed therefrom and transferred, one by one, to the preheating module 42.

At the preheating module 42, the wafers are placed into each of the positions of the rack 64 as the rack is indexed vertically by the elevator drive 80. When the rack 64 has been loaded to the capacity desired, with no open positions between wafers, the valve 58 at the port 56 is closed and the lamps 90 are energized to begin heating of the chamber 52 within the module 32. As the first batch of wafers was being heated in the preheat module 42, a second batch of wafers was being loaded through the load-lock 34 to the other preheat module 44.

The heating of the first batch of wafers is sensed by the sensors 92 that directly read the temperature of the wafers 62. The energy to the lamp banks 90 is controlled in response to signals from the sensors 93, 94 to approach gradually and hold a preset preheating temperature, that is typically in the range of 250° C. to 500° C. The preheating process, to remove absorbed water vapor and other gasses from the wafers 62, should continue at the preset temperature for from 10 to 30 minutes.

When the preheating of the wafers 62 in the module is complete, the gate valve 58 is opened and the wafers are transferred, one by one, sequentially through the transport module 12 and through the conduit 16 into the back transport module 14, from which each is sequenced into and out of any or all of the five process chambers 22–30 connected thereto for processing. As each of the wafers is processed, it is returned through the conduit 16 to the transport module 12 and into a cassette in one of the load-locks 32, 34, preferably the same load-lock 32 by which they entered the transport module 12. While the transferring of the first batch of wafers is being carried out, the second batch of wafers in the preheat module 44, is being heated in a similar manner. When the second batch of wafers has been preheated, a third batch is being similarly loaded into the first preheat module 42, and the sequence continues in the same manner from batch to batch.

Configurations of the machine that include two load-locks and two preheating modules provide the greatest flexibility and highest productivity of the machine, allowing the preheating of different batches of wafers to occur at least in part simultaneously, and allowing the loading and unloading of different batches of wafers to occur at least in part simultaneously. With such a configuration, the ability of batches to bypass each other and the efficient utilization of the transport mechanisms are increased. Four batches of wafers in addition to the wafers in the transport mechanisms and processing modules can be present in the cluster tool at one time with this configuration.

Where the configuration of the machine includes only one preheating module, or one load-lock, the present invention still provides for increased efficiency and processing quality.

In embodiments having only one load-lock, the preferred sequence of operation is to load a first cassette of wafers into the load-lock and into the internal environment, sequentially transporting the first batch to a preheat module for preheating, then sequentially transporting the preheated wafers of the first batch into and out of other process modules, after which they will be returned to the load-lock for removal from the machine in a cassette. Before the wafers of the first batch are returned to the load-lock, a second batch of wafers is loaded through the load-lock and placed into an empty preheating module.

If there is only one preheating module, this placement occurs after the first batch of heat pretreated wafers is removed from the preheating module. When the second batch of wafers is being preheated, any or all of the steps of processing or transporting of wafers of the first batch can be performed in a two preheat module configuration, and any or all of such steps subsequent to the unloading of the first batch of wafers from the preheating module can be performed in a single preheat module configuration.

With the above configuration and apparatus, wafers of various batches may be processed differently and follow different cycles through the cluster tool. Wafers of the same batch need not all follow the same course through the machine. The enhanced flexibility provided by the present invention optimizes the capabilities of programmed processing control, with increased productivity and efficiency in wafer processing.

From the above description, it will be apparent to one of ordinary skill in the art that alternatives to the embodiments described are possible without departing from the principles of the invention.

Accordingly, the following is claimed:

1. A method of processing wafers comprising the steps of:
   a) placing wafers of a first batch in a cassette into a load-lock closed to an internal machine environment and open to an external atmospheric pressure environment, sealing the load-lock with wafers of the first batch therein from the external environment, pumping the sealed load-lock to a vacuum pressure level of the internal machine environment, and opening the pumped load-lock to the internal environment;
   b) after the completion of step a), transporting wafers of the first batch one by one from the cassette in the opened load-lock and into a preheating module at the vacuum pressure level of the internal environment, sealing the first batch of wafers in the preheating module, and preheating wafers of the first batch sealed in the preheating module;
   c) placing wafers of a second batch in a cassette into a load-lock closed to the internal machine environment and open to an external atmospheric pressure environment, sealing the load-lock with wafers of the second batch therein from the external environment, pumping the sealed load-lock to the vacuum pressure level of the internal machine environment, and opening the pumped load-lock to the internal environment;
   d) after the completion of step b), opening the preheating module and removing preheated wafers of the first batch one by one therefrom in the internal environment;
   e) after the completion of step c), transporting wafers of the second batch one by one from the opened load-lock into which they were placed and into a preheating module at the vacuum pressure level of the internal environment, sealing wafers of the second batch in the preheating module, and preheating wafers of the second batch sealed in the preheating module; then
   f) while wafers of the second batch are being preheated in a preheating module in accordance with step e), sequentially transporting preheated wafers of the first batch through a plurality of processing modules in selective communication with the internal environment; and
   g) after the completion of step f), loading, one by one, wafers of the first batch that have been sequentially processed in accordance with step f) into a load-lock, sealed from the external environment and open to the internal environment.

2. The method of claim 1 wherein:
   the preheating module of steps b) and d) is a first preheating module and the preheating module of steps e) and f) is a second preheating module, whereby any of the recited steps and substeps thereof to be performed on wafers of the first batch can be performed while wafers of the second batch are being preheated in the first preheating module, and whereby any of the recited steps and substeps thereof to be performed on wafers of the second batch can be performed while wafers of the first batch are being preheated in the first preheating module.

3. The method of claim 1 wherein:
the load-lock of step a) is a first load-lock and the load-lock of step c) is a second load-lock, whereby any of the recited steps and substeps thereof to be performed on wafers of the first batch can be performed while wafers of the second batch are being loaded from or unloaded to the external environment, and whereby any of the recited steps and substeps thereof to be performed on wafers of the second batch can be performed while wafers of the first batch are being loaded from or unloaded to the external environment.

4. The method of claim 3 wherein:
the preheating module of steps b) and d) is a first preheating module and the preheating module of steps e) and f) is a second preheating module, whereby any of the recited steps and substeps thereof to be performed on wafers of the first batch can be performed while wafers of the second batch are being preheated in the first preheating module, and whereby any of the recited steps and substeps thereof to be performed on wafers of the second batch can be performed while wafers of the first batch are being preheated in the first preheating module.

5. A method of processing wafers comprising the steps of:
providing at least one transport module enclosing an internal volume continuously maintainable at a vacuum pressure level, the transport module having a plurality of ports and a wafer transport mechanism therein for transferring wafers individually among a plurality of modules, each of which is in selective vacuum communication with the internal volume through one of the ports;
connecting to a first one of the ports of the transport module a wafer processing module having a processing chamber therein such that the chamber therein is in selective vacuum communication with the internal volume of the transport module, the processing module being capable of performing at least one wafer coating, etching or other treating process on a wafer in the vacuum processing chamber contained therein;
connecting, to a second one of the ports of the transport module in selective vacuum communication through the second one of the ports with the internal volume of the transport module, a first batch cassette load-lock module having a loading door through which the load-lock chamber is in alternately selective communication with an external environment;
connecting at least two batch preprocessing modules, including first and second preprocessing modules, each having a preprocessing chamber therein, each respectively to a third and a forth one of the ports of the transport module in selective vacuum communication with the transport module, each preprocessing chamber containing a rack for holding a plurality of wafers thereon for simultaneous preprocessing and capable of receiving and presenting wafers individually from and to the internal volume of the transport module through the port while the preprocessing chamber is at the vacuum pressure level for the loading and unloading of wafers to and from the rack; and closing the third port and preprocessing a first batch of wafers in the first preprocessing module while opening the forth port and transferring wafers individually between the second preprocessing module and another one of the ports.

6. The method of claim 5 further comprising the steps of:
connecting a second batch cassette load-lock module having a load-lock chamber therein to a fifth one of the ports of the transport module in selective vacuum communication through the fifth port with the internal volume of the transport module, the second batch cassette load-lock module having a loading door through which the load-lock chamber is in alternately selective communication with an external environment; and
the transferring step includes the step of transferring wafers of a second batch individually between the second preprossing module and the second batch cassette module while the first batch is being preprocessed in the first preprocessing module.

7. A method of processing wafers comprising the steps of:
providing at least one transport module enclosing an internal volume continuously maintainable at a vacuum pressure level, the transport module having a plurality of at least four ports and a wafer transport mechanism therein for transferring individual wafers among a plurality of modules in selective vacuum communication therewith through the ports;
connecting a plurality of randomly accessible individual wafer processing modules, including a first and a second processing module, each to a respective first or second one of the ports of the transport module in selective vacuum communication with the internal volume of the transport module, each processing module being capable of performing at least one wafer coating, etching or other treating process on a wafer in a vacuum processing chamber contained therein;
connecting to a third one of the ports of the transport module a first load-lock module enclosing a load-lock chamber therein alternately communicable with the internal volume of the transport module through the third port and an external environment, the load-lock module having a loading door therein, a cassette holder therein for receiving and presenting a loaded cassette of wafers through the door from and to the external environment when the chamber of the load-lock is in communication therewith, and for receiving and presenting individual wafers through the port from and to the internal volume of the transport module when the chamber of the load-lock is in communication therewith;
connecting to a forth one of the ports of the transport module a first batch preprocessing module having a preprocessing chamber therein to a forth one of the ports of the transport module in selective vacuum communication with the transport module through the forth one of the ports, the preprocessing chamber containing a rack for holding a plurality of wafers thereon for simultaneous preprocessing, the rack being capable of receiving and presenting wafers individually from and to the internal volume of the transport module, only through the forth port, while the preprocessing chamber is at the vacuum pressure level for the loading and unloading of wafers to and from the rack; and closing the first one of the ports and preprocessing a first batch of wafers in the preprocessing module while transferring individual wafers between a plurality of the processing modules and sequentially subjecting the transferred wafers to a plurality of processes.

8. The method of claim 7 further comprising the step of:

connecting, to a fifth one of the ports of the transport module through the fifth one of the ports in selective vacuum communication with the internal volume thereof, a second batch preprocessing module having a preprocessing chamber therein, a second preprocessing chamber containing a rack for holding a plurality of wafers thereon for simultaneous preprocessing, the rack being capable of receiving and presenting wafers individually from and to the internal volume of the transport module, only through the sixth one of the ports, while the preprocessing chamber is at the vacuum pressure level for the loading and unloading of wafers to and from the rack; and individually transferring wafers of a second batch between the second preprocessing module and another one of the ports while the first batch is being preprocessed in the first preprocessing module.

9. The method of claim 7 wherein:

the batch preprocessing module comprises a heater capable of simultaneously heating a plurality of wafers supported on the rack in the preprocessing chamber; and the method further comprises the step of maintaining the wafers in the preprocessing chamber at a sustained spatially uniform temperature for a time that is long with respect to the average processing time of the processing modules.

10. The method of claim 9 wherein:

the heater includes a plurality of radiant heating elements located outside of the processing chamber; and the method further comprises the step of rotating the rack with respect to the heating elements while maintaining the wafers at the spacially uniform temperature.

11. The method of claim 9 wherein:

the preprocessing module includes an elevator; and the method further comprises the step of moving the wafers on the elevator in cooperating with movement of the transport mechanism to position the rack to receive batches of wafers of varying numbers of wafers without empty positions therebetween.

12. The method of claim 9 wherein:

the preprocessing module includes a pair of shields carried by the rack on the top and bottom thereof in positions respectively immediately above and below the positions of top and bottom wafer holding slots thereof, the shields being capable of rendering the heat received by wafers in the top and bottom wafer holding slots in the rack equal to that received by other wafers in the rack.

* * * * *